United States Patent [19]

Porter et al.

[11] Patent Number: 5,003,513

[45] Date of Patent: Mar. 26, 1991

[54] LATCHING INPUT BUFFER FOR AN ATD MEMORY

[75] Inventors: John D. Porter; Brian D. Branson, both of Austin, Tex.

[73] Assignee: Motorola, Inc., Schaumburg, Ill.

[21] Appl. No.: 513,126

[22] Filed: Apr. 23, 1990

[51] Int. Cl.$^5$ .............................................. G11C 11/41
[52] U.S. Cl. ........................ 365/230.08; 365/189.05; 365/202; 365/233.5; 307/279
[58] Field of Search .............. 365/233.5, 189.05, 202, 365/230.08; 307/279

[56] References Cited

U.S. PATENT DOCUMENTS

| 4,707,809 | 11/1987 | Ando | 365/230.08 |
|---|---|---|---|
| 4,712,197 | 12/1987 | Sodo | 365/233.5 |
| 4,716,550 | 12/1987 | Flannagan et al. | 365/230.08 |
| 4,843,596 | 6/1989 | Miyatake et al. | 365/233.5 |
| 4,852,063 | 7/1989 | McNutt | 365/189.05 |
| 4,912,679 | 3/1990 | Shinoda et al. | 365/230.08 |
| 4,939,692 | 7/1990 | Kendall | 365/230.08 |
| 4,943,962 | 7/1990 | Imamiya et al. | 365/230.08 |

Primary Examiner—Joseph E. Clawson, Jr.
Attorney, Agent, or Firm—James L. Clingan, Jr.

[57] ABSTRACT

An ATD memory has an input buffer which latches addresses while maintaining good D.C. margin, hysteresis, and transition detection. The input buffer includes two input circuits for receiving the address. A transmission-gate type latch is used to latch the outputs of the two input circuits. An internal buffer circuit receives the output of the latch and provides internal address signals useful to a decoder in selecting a memory cell. The internal buffer circuit also provides slow and fast signals useful in performing transition detection. The latch either provides outputs responsive to the address signal or an output representative of the address signal at the time a latch enable signal is received.

10 Claims, 2 Drawing Sheets

FIG. 1 —PRIOR ART—

LATCHING INPUT BUFFER FOR AN ATD MEMORY

FIELD OF THE INVENTION

The invention relates to latched memories, and more particularly, to address input buffers thereof.

BACKGROUND OF THE INVENTION

Static random access memories (SRAMs) are often used in the portion of a processing systems where speed is very important such as a cache. Most systems have a system clock to which all accesses are timed. There are various memories which can function using a system clock. Another clock which some systems have is an address latch enable signal ALE. In such a system, one logic state of signal ALE indicates that the external addresses are valid and the other state indicates that the addresses are invalid. There can thus be considered the valid state and the invalid state. An edge of a signal is the time at which the signal switches logic states so there are two edges per cycle. The edge which switches between the valid state and the invalid state is the edge at which address signals are to be latched because that is the indication that the address signals can become invalid. This can be considered the latching edge of signal ALE. So long as signal ALE is valid, the memory is intended to be responsive to the address signals. There are set-up and hold-time specifications for the address signals with respect to the latching edge of signal ALE. The set-up time is the time that the address signals must be valid prior to the latching edge of signal ALE in order for those address signals to be the ones that are responded to. The hold time is the time that the address signals must be maintained valid after the latching edge of signal ALE. The total of the set-up and hold times is desirably low. The total of the set-up and hold times is typically about 25% of the access time for a high speed SRAM. Generally, it is also desirable for the set-up and hold times to be about the same although there are some situations in which the hold time is zero at the cost of increasing the set-up time.

In such a system in which signal ALE is used and SRAMs are used, a typical approach is to use a conventional high speed SRAM and additionally use a latch for the addresses. The latch itself adds about 25% to the access time. For example, for a memory with an access time of about 23 nanoseconds, the latch adds about 6 nanoseconds of delay. Such a system is shown in FIG. 1 in which there is an integrated circuit SRAM 10 and a separate latch 11. Latch 11 receives the address signals from some address bus and latches them in response to the latching edge of signal ALE. While signal ALE is valid, latch 11 outputs the address signals at the logic state at which they are received. While signal ALE is invalid, latch 11 outputs the address signals at the logic states which were present at the time of the latching edge of signal ALE. The output of latch 11 will change again only if signal ALE switches to the valid state at which time latch 11 will output the address signals at the same states as that received. Memory 10 is a memory of the type which uses address transition detection (ATD). Memory 10 comprises an input buffer 12 for receiving a single address signal, an internal buffer 13, an ATD and summation circuit 14 for providing an equalization pulse EQ, a decoder 15, an array 16, and an equalization and precharge circuit 17 for receiving pulse EQ. Memory 10 also further comprises elements not shown such as an input buffer and internal buffer for each address signal. Also, ATD and summation circuit 14 may provide additional signals and may be used for purposes other than equalization and precharge.

Input buffer 12 detects the logic state of the received address signal and provides an output which is at full power supply levels. Internal buffer 13 provides the address signals to decoder 15 and fast and slow address signals to ATD and summation circuit 14 for detection of an address transition. ATD and summation circuit 14 uses slow and fast address signals to determine if an individual address has changed and, if one or more of individual address signals has changed state, generates equalization pulse EQ. Equalization and precharge circuit 17 equalizes and precharges the bit line pairs of array 16 in response to pulse EQ. Decoder 15 selects a predetermined number of cells, according to the part type such as ×11, ×4, ×8, etc., within array 16 for reading or writing. A particularly effective input buffer for use as input buffer 12 and internal buffer 13 is described in U.S. Pat. No. 4,807,198, Flannagan et al., which issued Feb. 21, 1989. The buffer described therein is particularly useful as an input buffer for an ATD memory by being effective in providing both desirable hysteresis and D.C. margin.

One advantage of having a memory with a latch such as 11 included therein is that of reducing the part count to achieve the desired function. The reduced part count would reduce the amount of board space required. The board would also then not have to have separate routing for the latched addresses. Of course addresses would still need to come to the memory but the bus which carried the unlatched addresses might also be close by anyway. There is also the potential for reducing the increase in access time due to the extra latch. An internal latch would certainly be expected to operate faster than 6 nanoseconds.

SUMMARY OF THE INVENTION

Accordingly, it is an object of the present invention to provide an improved memory in which the addresses are latched in response to a latch enable signal.

In accordance with the invention there is provided a memory having an array of memory cells coupled to bit line pairs and word lines in which a memory cell is selected in response to a plurality of address signals and in which the bit line pairs are equalized in response to an equalization pulse being generated in response to one or more of the address signals changing logic state. The memory comprises a non-inverting input circuit, an inverting input circuit, a transmission-gate latch, a cross-coupled latch, and an internal buffer. The non-inverting input circuit receives a first address signal of the plurality of address signals and has an output for providing an non-inverted, buffered first address signal. The inverting input circuit receives the first address signal and has an output for providing an inverted, buffered first address signal. The transmission-gate latch has first and second inputs coupled to the outputs of the first and second input means, respectively, and has a first output and a second output, and latches signals received on the first and second inputs in response to a latch enable signal switching from a first logic state to a second logic state. The cross-coupled latch has a first input coupled to the first output of the transmission gate latch, a second input coupled to the second output of the transmission gate latch, a first output, and a second output. The internal buffer is coupled to the first and second outputs of the cross-coupled latch and provides true and complementary internal address signals for use in selecting a memory cell and slow and fast address signals for use in detecting a change in logic state of the first address signal.

DETAILED DESCRIPTION OF THE INVENTION

Figure 1:
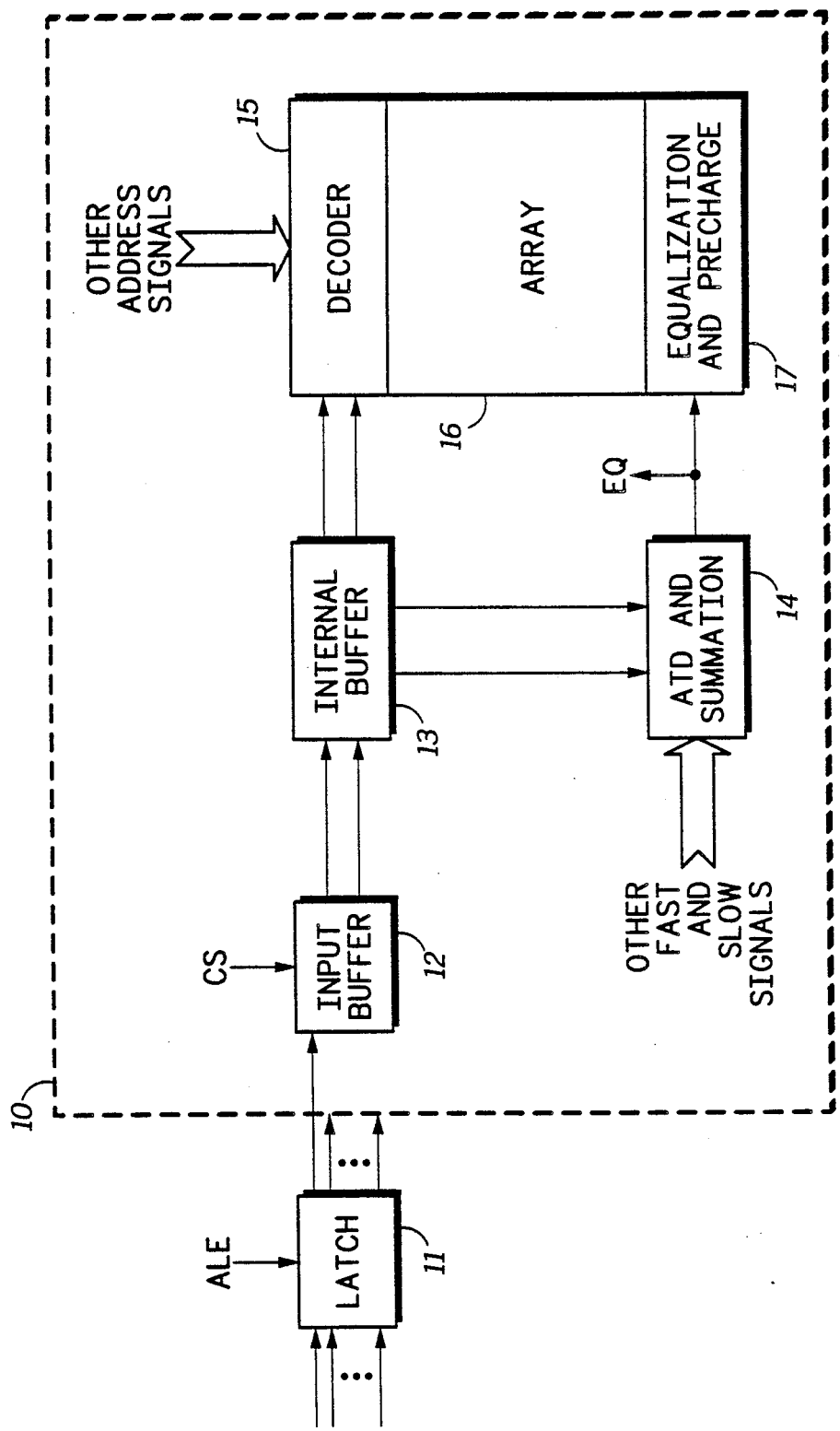
FIG. 1 is a block diagram of a SRAM and a latch according to the prior art.
Figure 2:
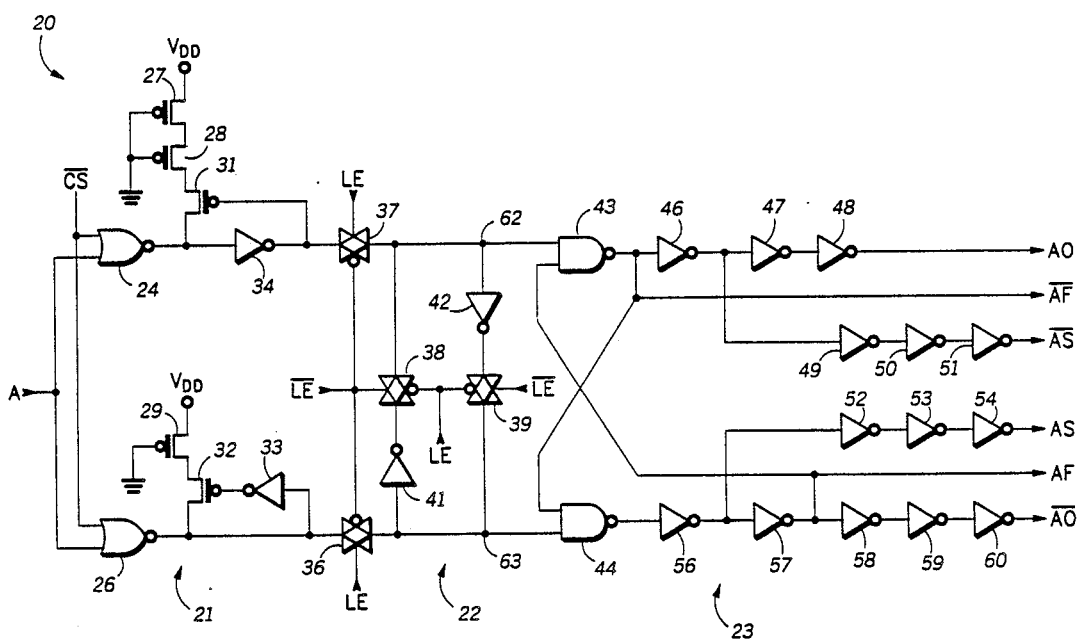
FIG. 2 is circuit diagram of a latching input buffer for use in a SRAM according to a preferred embodiment of the invention.

Shown in FIG. 2 is an input buffer 20 to replace latch 11, input buffer 12, and internal buffer 13. The function of replacing latch 11 is with respect to a single address signal not all of the address signals. Memory 10 would thus have an input buffer 20 for each address signal in the same way that there is an input buffer 12 and internal buffer 13 for each address signal. Buffer 10 comprises an input portion 21, a latch portion 22, and an internal buffer portion 23. Input portion 21 comprises a NOR gate 24, a NOR gate 26, P channel transistors 27, 28, 29, 31, and 32, and inverters 33 and 34. Latch portion 22 comprises transmission gates 36, 37, 38, and 39 and inverters 41 and 42. Internal buffer portion 23 comprises NAND gates 43 and 44 and inverters 46, 47, 48, 49, 50, 51, 52, 53, 54, 56, 57, 58, 59, and 60.

NOR gate 24 has a first input for receiving a chip select signal $\overline{CS}$, a second input for receiving address signal A, and an output. NOR gate 26 has a first input for receiving signal $\overline{CS}$, a second input for receiving signal A, and an output. Inverter 34 has an input connected to the output of NOR gate 24 and an output. Transistor 31 has a drain connected to the output of NOR gate 24, a gate connected to the output of inverter 34 and a source. Transistor 28 has a drain connected to the source of transistor 31, a gate connected to ground, and a source. Transistor 27 has a drain connected to the source of transistor 28, a gate connected to ground, and a source connected to a positive power supply terminal VDD. Transistor 32 has a drain connected to the output of NOR gate 26, a gate, and a source. Inverter 33 has an input connected to the output of NOR gate 26 and an output connected to the gate of transistor 32. Transistor 29 has a drain connected to the source of transistor 32, a gate connected to ground, and a source connected to VDD. Transmission gate 37 has a signal input connected to the output of inverter 34, a true control input for receiving latch enable signal LE, a complementary control input for receiving complementary latch enable signal $\overline{LE}$, and a signal output connected to a latch node 62. Transmission gate 36 has a signal input connected to the output of NOR gate 26, a true control input for receiving signal LE, a complementary control input for receiving signal $\overline{LE}$, and a signal output connected to a latch node 63. Inverter 41 has an input connected to latch node 63 and an output. Transmission gate 38 has a signal input connected to the output of inverter 41, a true control input for receiving signal $\overline{LE}$, a complementary control input for receiving signal LE, and a signal output connected to latch node 62. Inverter 42 has an input connected to latch node 62 and an output. Transmission gate 39 has a signal input connected to the output of inverter 42, a true control input for receiving signal $\overline{LE}$, a complementary control input for receiving signal LE, and a signal output connected to latch node 63. NAND gate 43 has a first input connected to latch node 62, a second input, and an output. NAND gate 44 has a first input connected to latch node 63, a second input connected to the output of NAND gate 43, and an output. Inverter 46 has an input connected to the output of NAND gate 43 and an output. Inverter 47 has an input connected to the output of inverter 46, and an output. Inverter 48 has an input connected to the output of inverter 47, and an output for providing output address signal $\overline{AO}$. Inverter 49 has an input connected to the output of inverter 46, and an output. Inverter 50 has an input connected to the output of inverter 49, and an output. Inverter 51 has an input connected to the output of inverter 50, and an output for providing complementary slow address signal $\overline{AS}$. Inverter 56 has an input connected to the output of NAND gate 44, and an output. Inverter 57 has an input connected to the output of inverter 56, and an output for providing true fast address signal AF. Inverter 58 has an input connected to the output of inverter 57, and an output. Inverter 59 has an input connected to the output of inverter 58, and an output. Inverter 60 has an input connected to the output of inverter 59, and an output for providing a complementary output address signal AO. Inverter 52 has an input connected to the output of inverter 56, and an output. Inverter 53 has an input connected to the output of inverter 52, and an output. Inverter 54 has an input connected to the output of inverter 53, and an output for providing true slow address signal AS. The output of NAND gate 43 provides complementary fast address signal $\overline{AF}$.

Signal $\overline{CS}$ is a conventional chip select signal which is used to disable the memory and more particularly in this case to disable the input buffer. When signal $\overline{CS}$ is a logic high NOR gates 24 and 26 are both forced to provide a logic low output. In the case where chip select signal $\overline{CS}$ is a logic low, which is the active condition of chip select signal $\overline{CS}$, NOR gates 24 and 26 are responsive to address signal A. Thus, in the active operation of buffer 20, chip select signal $\overline{CS}$ is a logic low. In such a case NOR gates and 26 each provide an output at a logic state opposite of that of address signal A. Inverter 34 inverts the output of NOR gate 24 and provides the resulting inverted signal to transmission gate 37. Thus, transmission gate 37 receives a signal at a logic state which is the same as that of address signal A. Transmission gate 36 receives the output of NOR gate 26 so that transmission gate 36 receives a signal at a logic state opposite to that of address signal A. If signal LE is active, which is the logic high condition, transmission gates 36 and 37 will be conductive so that the logic state received on their respective signal inputs will be coupled to the first inputs of NAND gates 43 and 44, respectively. If signal LE is a logic high, transmission gates 38 and 39 will be nonconductive. Latch nodes 62 and 63 will thus be responsive to signal A. Latch node 62 will be at the same logic state as signal A, whereas latch node 63 will be at the opposite logic state of signal A. For the case in which signal A is a logic high, latch node 62 will be a logic high and latch node 63 will be a logic low. With latch node 63 as a logic low, NAND gate 44 will be forced to provide a logic high output. Inverter 56 will invert that to provide a logic low output which will be received by inverters 52 and 57. Inverter 57 will respond by providing a logic high output as fast address signal AF which is also coupled to the second input of NAND gate 43 with a logic high on both inputs of NAND gate 43. NAND gate 43 will provide a logic low output to NAND gate 44 and will provide complementary fast address signal $\overline{AF}$ at a logic low. Inverter 46 will provide a logic high output to inverters 47 and 49. Inverter 47 will provide a logic low output to inverter 48. Inverter 48 responds by providing output address signal AO at a logic high. Inverter 49 responds to the logic high provided to its input by providing a logic low output to inverter 50. Inverter 50 responds by providing a logic high output to inverter 51. Inverter 51 responds by providing complementary slow address signal $\overline{AS}$ at a logic low. Inverter 52 responds to the logic low output of inverter 56 by providing a logic high output. Inverter 53 responds by providing a logic low output to inverter 54. Inverter 54 responds by providing true slow address signal AS at a logic high.

For the case in which signal A is a logic low, latch node 62 will be a logic low and latch node 63 will be a logic high. NAND gate 43 responds to the logic low on latch node 62 by providing a logic high output as complementary fast address signal $\overline{AF}$ and a logic high to the second input of NAND gate 44. Both inputs of NAND gate 44 are a logic high which causes NAND gate 44 to provide a logic low output. Inverters 46 through 54 and 56 through 60 respond by each one inverting its input so that output address signal AO is provided at a logic low, complementary slow address signal $\overline{AS}$ is provided at a logic high, true slow address signal AS is provided at a logic low, true fast address signal AF is provided as a logic low and complementary address signal AO is provided at a logic high. The slow and fast address signals of the same type reach the same logic state with the fast address signal reaching the resulting logic state more quickly than the slow address signal. The time differential between the fast address signal changing logic state and the slow address signal changing state is used to detect a change in the address. This time differential is also useful in establishing a pulse duration in response to a change in logic state of the address signal. This concept of using fast and slow address signals is conventional for use in address transition detection memories. P channel transistors 27, 28, and 31 along with inverter 34 act as a hysteresis network which has been found to be desirable. Similarly, transistors 29 and 32 and inverter 33 act as a hysteresis network. The advantages of this are described in U.S. Pat. No. 4,807,198, Flannagan et al, issued Feb. 21, 1989. So long as signal LE is logic high and thus signal $\overline{LE}$ is a logic low, input buffer 20 acts in a conventional manner so that the memory operates as a conventional SRAM. Transmission gates 37 and 36 add virtually no delay in propagating the signal provided by inverter 34 to NAND gate 43 and the signal provided by NOR gate 26 to NAND gate 44. When signal LE switches to a logic low transmission gates 37 and 36 become nonconductive which blocks the signal path between inverter 34 and NAND gate 43 and the signal path between NOR gate 26 and NAND gate 44. Signal LE switching to a logic low also causes transmission gate 38 and 39 to become conductive. With transmission gate 38 conductive, the output of inverter 41 is coupled to latch node 62. The input of inverter 41 is coupled to latch node 63 so that the output of inverter 41 is the opposite logic state of that of latch node 63. Inverter 41 thus actively provides the logic state opposite to that of latch node 63. Similarly, with transmission gate 39 conductive, inverter 42 actively provides a logic state to node 63 which is opposite to that of node 62. This has the effect of actively latching the logic states present on nodes 62 and 63 at the time signal LE switches to a logic low.

The placement of latch portion 22 provides significant improvement over the prior art. If the latch preceded input portion 21 there would be significant disadvantages in relation to the placement of latch portion 22 as shown in FIG. 2. For example, if a latch of the type shown in FIG. 2 were on the input that would mean that a heavily doped region in the substrate would receive the input signal. Transmission gates are parallel connected P and N channel transistors. The input is a heavily doped region in the substrate in each of these transistors. In order for a heavily-doped region to receive a signal which is provided from a source which is external to the integrated circuit, the heavily-doped region must have a guard ring around it to avoid latch up. This guard ring adds additional space. Additionally, the active input circuitry is quite capacitive due to the size and gain requirements of an input circuit. Transmission gates would add significantly to this capacitance on the input because the transmission gates would also need to be quite large. The size of the transmission gates is directly related to the conductivity. The conductivity is desirably high so the size would need to be large. The reason the conductivity should be high is to minimize the RC delay between the transmission gate and the active input circuitry. However, increasing the size of the transmission gates also tends to slow down the response time to the input because there is the resistor which is intentionally provided on an input as a standard precaution for latch up and high voltage considerations. This resistance would be in series with the capacitance of the transmission gate, thus there would be an increase in the RC time constant as the transmission gate size was increased. Other types of latches might be used but they would cause more delay because it would be additional propagation through active circuits. Additionally, these other type of latch circuits may likely disturb the very desirable hysteresis and D.C. margin characteristics of the input buffer described in U.S. Pat. No. 4,807,198. Another disadvantage of a transmission-gate type latch directly on the input is the mere fact of added capacitance on the input that has to be driven by the user. Another advantage of the location of the latch shown in FIG. 2 relates to the fact that there is some delay in the latch receiving the address signal. This delay helps match the delay in the latch enable signal being received by the latch. Any externally received signal, including an externally provided latch enable signal, must be buffered. Accordingly there is some delay, due to the buffering, in the latch enable signal being received by the latch regardless of where the latch is placed. If the latch enable signal were slower in being received by the latch than the input signal, that would tend to increase the hold time specification. The signal would need to be held valid a little bit longer to allow the latch enable signal to be received by the latch. Thus, the present placement of the latch adds essentially no time to the access time, maintains the desirable hysteresis and D.C. margin characteristics useful particularly for address transition detection, does not add capacitance to the input terminal, and does not disturb the set up and hold time characteristics.

While the invention has been described in a specific embodiment, it will be apparent to those skilled in the art that the disclosed invention may be modified in numerous ways and may assume many embodiments other than those specifically set out and described above. For, example combinations of inverters could be used for generating the true and complementary output address signals and signals useful for address transition detection. Accordingly, it is intended by the appended claims to cover all modifications of the invention which fall within the true spirit and scope of the invention.

We claim:

1. An input buffer circuit for providing true and complementary signals in response to an input signal switching between first and second voltages, comprising:

a first buffer having an input for receiving the input signal and, an output for providing a first intermediate signal responsive thereto;

a second buffer having an input for receiving the input signal, an output for providing a second intermediate signal responsive thereto;

a first transmission gate have a coupling input coupled to the output of the first buffer and a coupling output, said first transmission gate coupling the coupling input thereof to the coupling output thereof when an address enable signal is valid and for decoupling the coupling input thereof from the coupling output thereof when the address enable signal is invalid;

a second transmission gate have a coupling input coupled to the output of the second buffer and a coupling output, said first transmission gate coupling the coupling input thereof to the coupling output thereof when the address enable signal is valid and for decoupling the coupling input thereof from the coupling output thereof when the address enable signal is invalid;

a cross-coupled latch having an inverting input coupled to the coupling output of the first transmission gate, a non-inverting input coupled to the coupling output of the second transmission gate, a first output for providing the true signal, and a second output for providing the complementary signal;

a serially-coupled first inverter and third transmission gate, coupled between the inverting and non-inverting inputs of the cross-coupled latch, for providing, in inverted form, the signal present on the inverting input of the cross-coupled latch to the non-inverting input of the cross-coupled latch;

a serially-coupled second inverter and fourth transmission gate, coupled between the non-inverting and inverting inputs of the cross-coupled latch, for providing, in inverted form, the signal present on the non-inverting input of the cross-coupled latch to the inverting input of the cross-coupled latch;

a first hysteresis circuit coupled to the output of the first buffer for causing the first buffer to provide the first intermediate signal at a voltage which, for a first predetermined range of voltage of the input signal between the first and second voltages, is different for a transition of the input signal from the first voltage to the second voltage than for a transition of the input signal from the second voltage to the first voltage; and a second hysteresis circuit coupled to the output of the second buffer for causing the second buffer to provide the second intermediate signal at a voltage which, for a second predetermined range of voltage of the input signal between the first and second voltages, is different for a transition of the input signal from the first voltage to the second voltage than for a transition of the input signal from the second voltage to the first voltage.

2. A memory, comprising:

an array of memory cells;

a decoder, coupled to the array, for selecting at least one memory cell in response to a plurality of internal address signals;

a first buffer having an input for receiving an external address signal, and an output for providing a first intermediate signal responsive thereto;

a second buffer having an input for receiving the external address signal, and an output for providing a second intermediate signal responsive thereto;

an address latch coupled to the outputs of the first and second output buffers for coupling the first and second intermediate signals to first and second latch nodes, respectively, when an address latch enable signal is valid and for latching the first and second intermediate signals onto the first and second latch nodes, respectively, in response to the address latch enable signal becoming invalid;

a cross-coupled latch having an inverting input coupled to the first latch node, a non-inverting input coupled to the second latch node, a first output for providing a true address signal, and a second output for providing a complementary address signal;

amplifier means, coupled to the cross-coupled latch and the decoder, for providing true and complementary internal address signals and slow and fast signals;

transition detection means, coupled to the amplifier means, for initiating an equalization pulse in response to the true and fast signals switching logic state; and equalization means for equalizing bit lines in the array in response to the equalization pulse.

3. A memory having an array of memory cells coupled to bit line pairs and word lines in which a memory cell is selected in response to a plurality of address signals and in which the bit line pairs are equalized in response to an equalization pulse being generated in response to one or more of the address signals changing logic state, comprising:

a first inverter having an input for receiving a first address signal of the plurality of address signals, and an output;

a second inverter having an input for receiving the first address signal, and an output;

third inverter having an input coupled to the output of the first inverter, and an output;

a transmission gate latch having first and second inputs coupled to the outputs of the third inverter and second inverter, respectively, having a first output and a second output, and which latches signals received on the first and second inputs in response to a latch enable signal switching from a first logic state to a second logic state;

a cross-coupled latch having a first input coupled to the first output of the transmission gate latch, a second input coupled to the second output of the transmission gate latch, a first output, and a second output; and an internal buffer, coupled to the first and second outputs of the crosscoupled latch, for providing true and complementary internal address signals for use in selecting a memory cell and slow and fast address signals for use in detecting a change in logic state of the first address signal.

4. The memory of claim 3 further comprising a transition detector for receiving the slow and fast address signals and providing the equalization pulse in response to a change in said slow and fast address signals.

5. The memory of claim 4 further comprising a first hysteresis circuit coupled to the output of the first inverter and a second hysteresis circuit coupled to the output of the second inverter.

6. The memory of claim 5 wherein the first hysteresis circuit comprises:
- a first transistor having a control electrode coupled to the output of the third inverter, a first current electrode coupled to the output of the first inverter, and a second current electrode; and
- a second transistor having a control electrode coupled to a first power supply terminal, a first current electrode coupled to the second current electrode of the first transistor, and a second current electrode coupled to a second power supply terminal.

7. The memory of claim 6 wherein the second hysteresis circuit comprises:
- a fourth inverter having an input coupled to the output of the second inverter, and an output;
- a third transistor having a control electrode coupled to the output of the fourth inverter, a first current electrode coupled to the output of the second inverter, and a second current electrode; and
- a fourth transistor having a control electrode coupled to the first power supply terminal, a first current electrode coupled to the second current electrode of the third transistor, and a second current electrode coupled to the second power supply terminal.

8. A memory having an array of memory cells coupled to bit line pairs and word lines in which a memory cell is selected in response to a plurality of address signals and in which the bit line pairs are equalized in response to an equalization pulse being generated in response to one or more of the address signals changing logic state, comprising:
- non-inverting input means for receiving a first address signal of the plurality of address signals and having an output for providing a non-inverted, buffered first address signal;
- inverting input means for receiving the first address signal and having an output for providing an inverted, buffered first address signal;
- a transmission-gate latch which has first and second inputs coupled to the outputs of the first and second input means, respectively, which has a first output and a second output, and which latches signals received on the first and second inputs in response to a latch enable signal switching from a first logic state to a second logic state;
- a cross-coupled latch having a first input coupled to the first output of the transmission gate latch, a second input coupled to the second output of the transmission gate latch, a first output, and a second output; and
- an internal buffer, coupled to the first and second outputs of the cross-coupled latch, for providing true and complementary internal address signals for use in selecting a memory cell and slow and fast address signals for use in detecting a change in logic state of the first address signal.

9. The memory of claim 8 wherein the latch means comprises:
- a first transmission gate have a coupling input coupled to the output of the non-inverting input means and a coupling output, said first transmission gate coupling the coupling input thereof to the coupling output thereof when an address enable signal is valid and for decoupling the coupling input thereof from the coupling output thereof when the address enable signal is invalid;
- a second transmission gate have a coupling input coupled to the output of the second buffer and a coupling output, said first transmission gate coupling the coupling input thereof to the coupling output thereof when an address enable signal is valid and for decoupling the coupling input thereof from the coupling output thereof when an address enable signal is invalid;
- a first inverter having an input coupled to the coupling output of first transmission gate, and an output;
- a second inverter having an input coupled to the coupling output of the second transmission gate, and an output;
- a third transmission gate have a coupling input coupled to the output of the first inverter and a coupling output coupled to the output of the second transmission gate, said third transmission gate coupling the coupling input thereof to the coupling output thereof when the address enable signal is invalid and for decoupling the coupling input thereof to the coupling output thereof when an address enable signal is valid;
- a fourth transmission gate have a coupling input coupled to the output of the second inverter and a coupling output, said first transmission gate coupling the coupling input thereof to the coupling output thereof when the address enable signal is invalid and for decoupling the coupling input thereof from the coupling output thereof when the address enable signal is valid;

10. The memory of claim 9 further comprising a transition detector for receiving the slow and fast address signals and providing the equalization pulse in response to a change in said slow and fast address signals.

* * * * *